United States Patent
Harshfield

[19]

[11] Patent Number: 5,851,882
[45] Date of Patent: Dec. 22, 1998

[54] ZPROM MANUFACTURE AND DESIGN AND METHODS FOR FORMING THIN STRUCTURES USING SPACERS AS AN ETCHING MASK

[75] Inventor: Steven T. Harshfield, Emmott, Id.

[73] Assignee: Micron Technology, Inc., Boise, Id.

[21] Appl. No.: 642,769

[22] Filed: May 6, 1996

[51] Int. Cl.⁶ ............................................. H01L 21/8246
[52] U.S. Cl. ..................... 438/275; 438/130; 438/983
[58] Field of Search .................... 438/275, 120, 438/170; 257/910; 439/983

[56] References Cited

U.S. PATENT DOCUMENTS

| | | |
|---|---|---|
| 3,717,852 | 2/1973 | Abbas et al. . |
| 4,203,123 | 5/1980 | Shanks . |
| 4,598,386 | 7/1986 | Roesner et al. ........................ 365/105 |
| 4,881,114 | 11/1989 | Mohsen et al. ............................ 357/54 |
| 5,130,777 | 7/1992 | Galbraith et al. ......................... 357/51 |
| 5,296,716 | 3/1994 | Ovshinsky et al. ......................... 257/3 |
| 5,379,250 | 1/1995 | Harshfield ............................... 365/105 |

FOREIGN PATENT DOCUMENTS

| | | |
|---|---|---|
| 60-136099 | 7/1985 | Japan .............................. G11C 17/06 |
| 3-225864 | 10/1991 | Japan ............................. H01L 27/102 |
| 2 065 972 A | 7/1981 | United Kingdom . |

*Primary Examiner*—Jey Tsai
*Attorney, Agent, or Firm*—Fletcher, Yoder & Edwards

[57] ABSTRACT

A cost-competitive, dense, CMOS compatible ZPROM memory array design and method of manufacture is disclosed. The method of manufacture includes a novel method for forming extremely thin diodes and thin strips of other materials such as conductors by using oxide spacers as an etching mask.

31 Claims, 18 Drawing Sheets

ZPROM MANUFACTURE AND DESIGN AND METHODS FOR FORMING THIN STRUCTURES USING SPACERS AS AN ETCHING MASK

FIELD OF THE INVENTION

This invention relates generally to the field of integrated circuit devices, and more particularly relates to an integrated circuit memory comprising an array of Zener diodes in series with programmable memory elements and to a design and method of manufacturing such a device. Another aspect of the invention relates to etching techniques for the formation of extremely thin structures for integrated circuit technologies.

BACKGROUND OF THE INVENTION

A ZPROM (Zener Programmable Read Only Memory) is a relatively new type of one time programmable non-volatile memory. In U.S. Pat. No. 5,379,250, for example, the ZPROM array is composed of a plurality of interconnected ZPROM cells which are randomly accessible with a unique biasing scheme. The contents of that patent disclose how to use a ZPROM array manufactured using the processes disclosed herein and are incorporated by reference.

The ZPROM cell is composed of a Zener diode in series with a thin dielectric antifuse. The Zener diode allows electrical access to the antifuse and the antifuse stores one "bit" of memory. Initially, the antifuse is non-conductive and is regarded as being in the "zero" state. If a "one" state is written to the memory cell, the antifuse becomes conductive.

A ZPROM has many unique characteristics. First, the ZPROM cell is a two terminal device which simplifies memory array construction and operation. Next, a Zener diode has more current capacity than other memory access devices of the same size. Most importantly, the unique biasing of the Zener array prohibits current leakage to the substrate by parasitic bipolar transistors. Parasitic bipolar transistors are a major disadvantage in a standard diode array, which is the most common two terminal access device array.

A ZPROM has the disadvantage of being a one time programmable memory. To compete with reprogrammable memories, it must contain clear advantages in other areas. Fortunately, the nature of the ZPROM allows many consumer advantages: low cost, massive memory, speed, and reliable programming. Its small cell size and minimization of parasitic transistors effects permit a higher cell density than most other memory arrays. A higher cell density means economical memory and massive memory storage per device. The Zener diode high current capacity means faster memory access, as well as ample current for reliable programming. The disclosed ZPROM array structure seeks to maximize these natural advantages.

SUMMARY OF THE INVENTION

In accordance with the present invention, a cost-competitive, dense, high current ZPROM array design and method of manufacture are disclosed which allows the ZPROM array to be easily embedded in CMOS applications. Efficient integration of ZPROM manufacture with CMOS manufacture is enabled by the use of the CMOS gate polysilicon and gate oxide in the manufacture of the array. Furthermore, because the processing steps of the array involve relatively few heat cycles, minimal disruption of previously engineered CMOS dopant profiles will result.

In accordance with one aspect of the present invention, a manufacturing method for the ZPROM array is disclosed which comprises fabricating an extremely thin diode, using previously deposited silicon dioxide (oxide) spacers as an etching mask. This allows for the manufacture of a vertical diode that is substantially as thick as the overlying spacer. Spacers have traditionally not been used in semiconductor processing as stand alone etching masks but only as offset masks for ion implantation in the formation of transistor junctions. This novel use of spacers as stand alone masks may also be extended to the etching of other underlying materials into much thinner strips than can currently be fabricated using conventional lithographic methods.

BRIEF DESCRIPTION OF THE PREFERRED EMBODIMENTS

It will be appreciated that the present invention may take many forms and embodiments beyond those described herein. It is not intended that the specific embodiments that are described herein should limit the invention.

Figure 1:
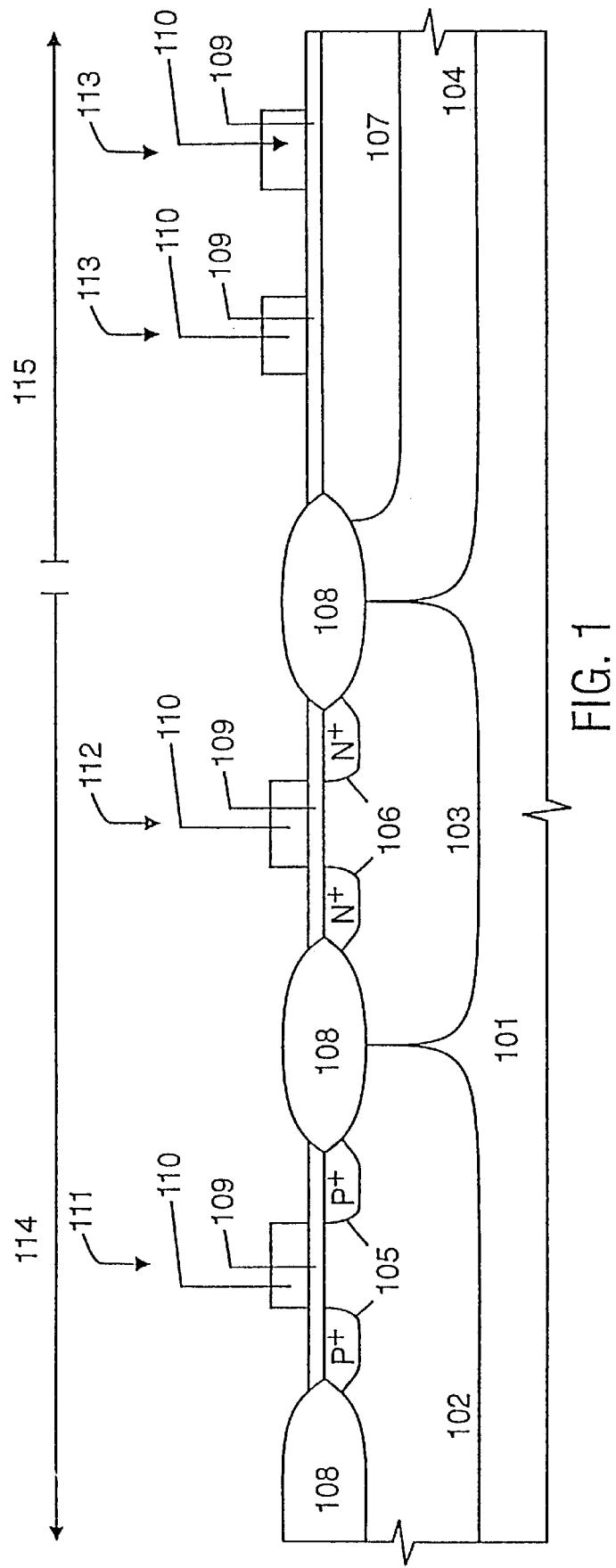
FIG. 1 is a cross section of a substrate showing the status of the manufacturing process before the cells in the array are formed.

Referring to FIG. 1, a cross-section of a lightly P doped silicon crystalline substrate 101 is shown as it appears just after the formation of the CMOS transistors 111 and 112 and array hard mask 113 in accordance with the present invention. The sequence of steps performed up to this point in the process shown in FIG. 1 are as follows: after ion implantation of the periphery N-well 102, array N-well 104, and periphery P-well 103, field oxide isolation 108 is grown on the surface of the crystalline substrate 101 using traditional processing methods. Field oxide 108 and array N-well 104 are used to electrically isolate array area 115, which contains the memory cells, from periphery area 114, which contains the CMOS (Complementary-Metal-Oxide-Semiconductor) logic transistors and other support circuitry. Next, another ion implantation is performed to define a P doped region 107. One of ordinary skill in the art will understand that doping by ion implantation is used to impart different conductivities to the crystalline silicon and to promote conduction via different charge carriers (i.e., electrons in N doped silicon; holes in P doped silicon). While the depth and doping concentrations of the array N-well 104, and P doped region 107 are in part determined according to the desired Zener diode performance, reasonable, but not exclusive values are as follows: array N-well 104=1E15 to 1E16 atoms/cubic cm, depth =2 microns (or other standard well depths); P doped region 107=1E17 to 1E18, depth=0.8 microns.

Next, a high quality thermal oxide 109 is grown on the resulting structure to a preferred thickness of approximately 150 Angstroms. Oxide 109 may grow somewhat thicker on P-type layer 107, since it has a higher doping concentration than a standard well. A layer of polysilicon 110 is deposited on the surface of the structure to a preferred thickness of approximately 2,000 to 4,000 Angstroms. Polysilicon 110, after pattern and etch, acts as the gate conductor for P-type 111 and N-type 112 CMOS transistors and as the upper layer of the array hard mask 113. Oxide 109 acts as the gate oxide for P-type 111 and N-type 112 CMOS transistors and as the lower layer of the array hard mask 113. At least three photolithographic masks are needed to define polysilicon 110 and transistor junctions 105 and 106. Preferably, the P-type 111 and N-type 112 CMOS transistor gates and the array hard mask 113 are patterned and anisotropically etched out of polysilicon layer 110 by three different photolithography and etch steps. This allows for each of the CMOS transistor's junctions to be formed after the gate for the CMOS transistor is etched. For example, after the gates are etched for the P-type 111 transistors, but before the photoresist associated with the etch is removed, P-type transistor junctions 105 are formed by ion implantation. Likewise, after the gates are etched for the N-type 112 transistors, but before the photoresist associated with the etch is removed, N-type transistor junctions 106 are formed by ion implantation. These CMOS transistors are used to route signals into and out of the array. Those of ordinary skill in the art will appreciate that an effective CMOS transistor could be built using other processing enhancements besides those depicted in FIG. 1. The array hard mask 113 is used to protect the bit line area in the array from the first silicon trench etch and it serves as a definition means for the oxide spacer hard mask, as discussed in connection with FIGS. 2 and 3.

Figure 2:
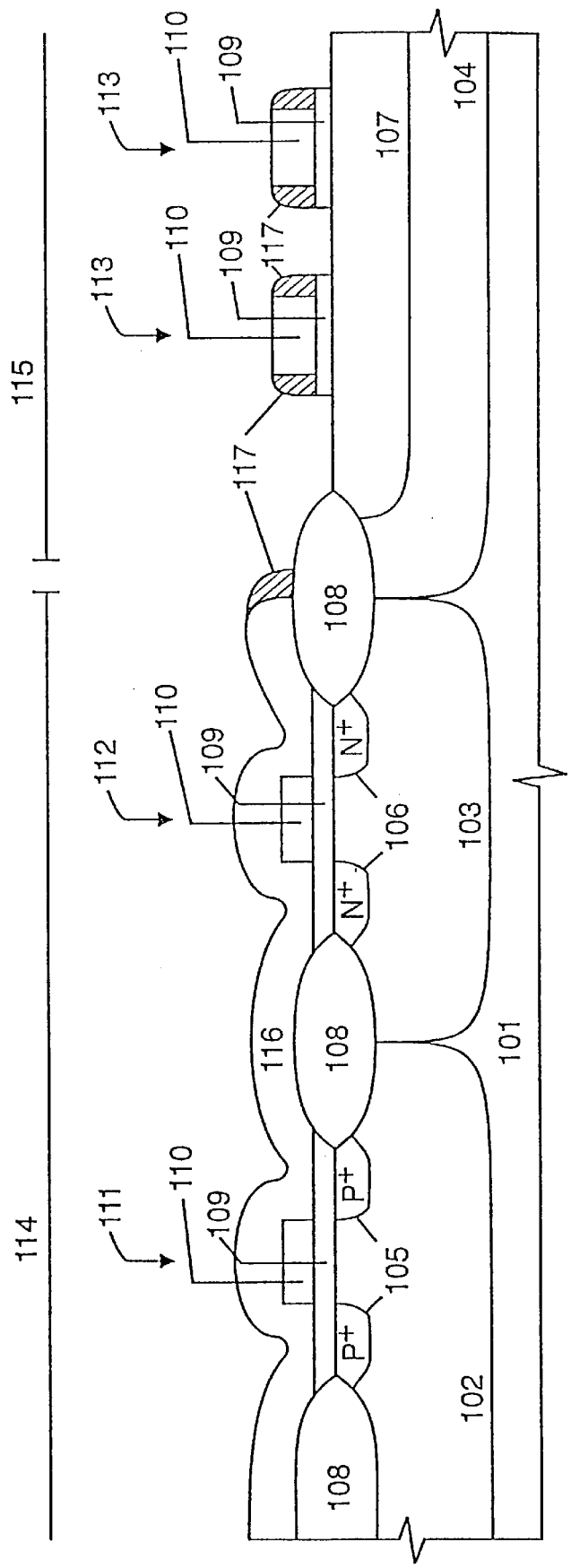
FIG. 2 is a cross section of a substrate showing the resulting structure after a thick oxide has been deposited on the periphery and spacers have been formed.

Referring to FIG. 2, a thick oxide layer 116 is deposited over all structures and is selectively removed from the array area 115. Next, a thinner conformal oxide is deposited over all structures. This oxide and the underlying oxide 109 then are subjected to an anisotropic dry etch (spacer etch) to remove them from all horizontal surfaces. What remains are oxide spacers 117 on the sides of the hard mask 113. Oxide spacers 117 form a unique etch hard mask. They will eventually stand alone, without hard mask 113, to protect the underlying silicon which will become the thin Zener diodes, as discussed in connection with FIG. 3A.

Figure 3A:
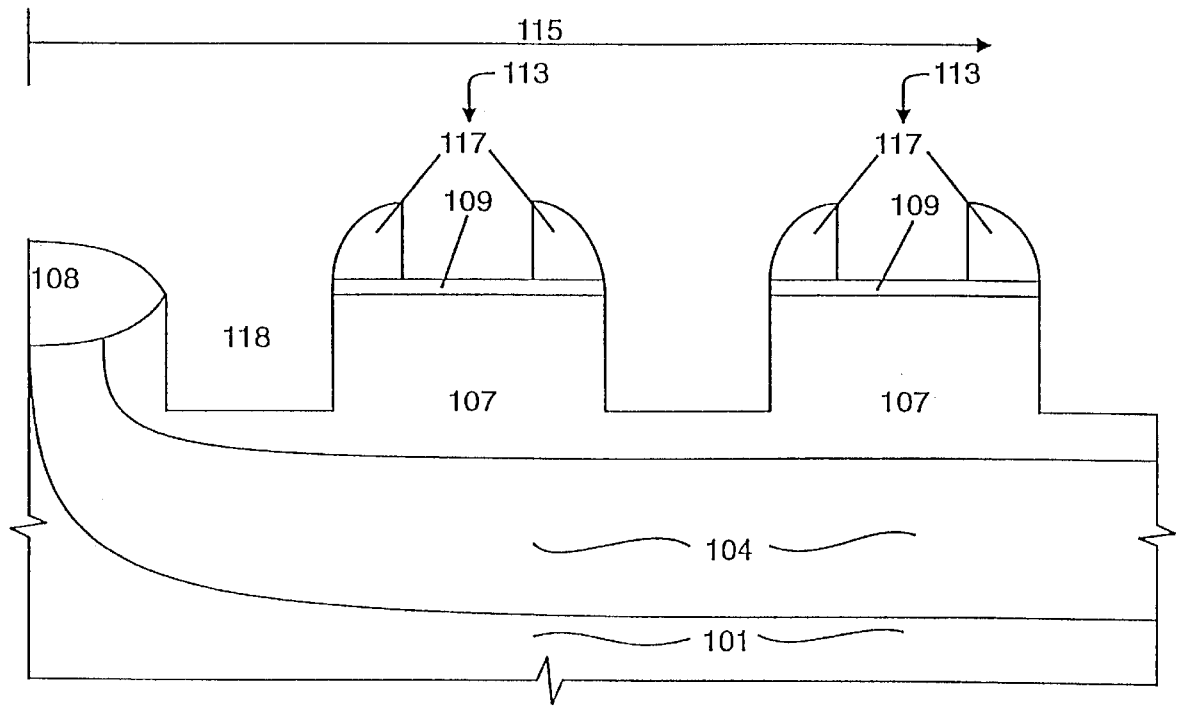
FIG. 3A is a cross section of a substrate showing the resulting structure in the array after a first trench etch.

Referring to FIG. 3A, array area 115 is etched, resulting in the structure shown. A first silicon trench etch anisotropically removes the P doped region 107 from between the hard mask structures 113. The trench etches described herein should have good selectivity to etching silicon while not substantially etching oxides. The etch also removes the polysilicon 110 of the hard mask 113 and stops on oxide 109. The trench 118 has an initial depth in the range of 6,000 to 10,000 Angstroms and will most likely not penetrate the junction between the P doped region 107 and the array N-well 104. Although not shown in FIG. 3A, oxide layer 116 will protect the CMOS transistors in the periphery area 114 during the first silicon trench etch. For efficiency, the spacer etch and the first silicon trench etch can be done in sequence in the same etch machine.

Figure 3B:
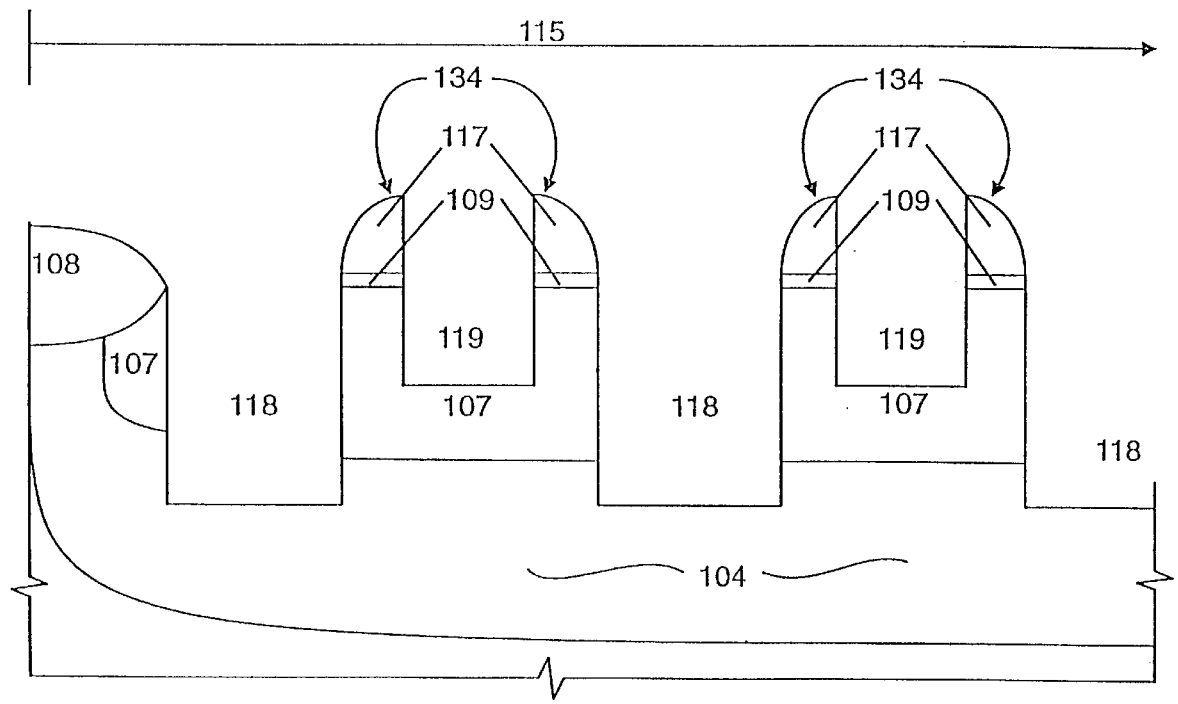
FIG. 3B is a cross section of a substrate showing the resulting structure in the array after a second trench etch.

Referring to FIG. 3B, array area 115 receives an oxide etch (to remove oxide 109 where exposed) and a second silicon trench etch resulting in the structure shown. Oxide spacer 117 again acts as a hard mask for both the first and second silicon trench etches. The bottom of the deep trench area 118 is in the N-well. The bottom of the shallow trench area 119 is in the P-type layer. The bottom of deep trench area 118 is at least 1,000 Angstroms below the bottom of P doped region 107 and the bottom of the shallow trench area 119 is at least 1,000 Angstroms above the bottom of the P doped region 107. The P doped region 107 is thus completely divided by the deep trench 118 to form distinct array bit lines out of the remaining P doped region 107, two of which are shown in cross-section in FIG. 3B. One of ordinary skill will appreciate that the remaining P doped region 107 will likely be very long and could run for the entire length of the array. Many ZPROM cells will ultimately be electrically connected to a single bit line, as discussed later. The P doped region 107 is recessed by trench 119 to provide an area for a low resistance bit line strap, to be discussed in connection with FIG. 5. The P doped silicon 107 under spacer 117 is left intact for eventual thin Zener diode formation and at this stage of the process stands as a silicon wall 134 which runs around the perimeter of the bit line. For the greatest efficiency, the last four etches (spacer etch, first silicon trench etch, oxide etch, and second silicon trench etch) can be done in sequence in the same etch machine.

Figure 4A:
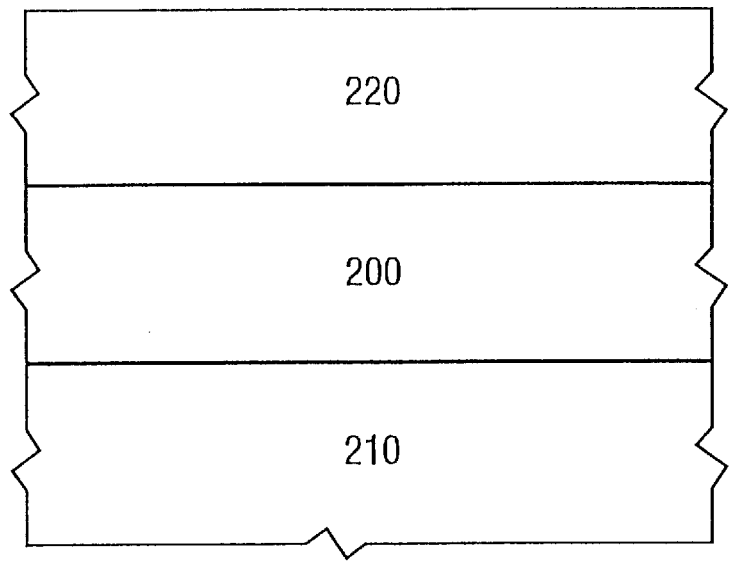
FIG. 4A is a cross section of polysilicon over metal.
Figure 4B:
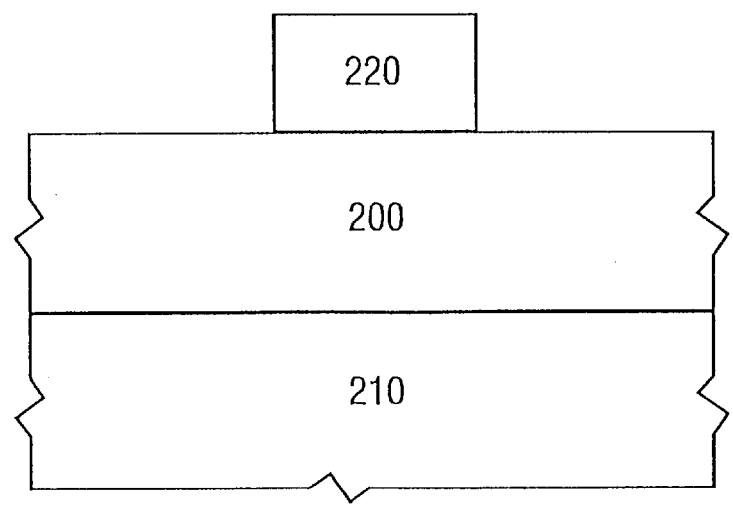
FIG. 4B is a cross section showing the resulting structure after polysilicon pattern and etch.
Figure 4C:
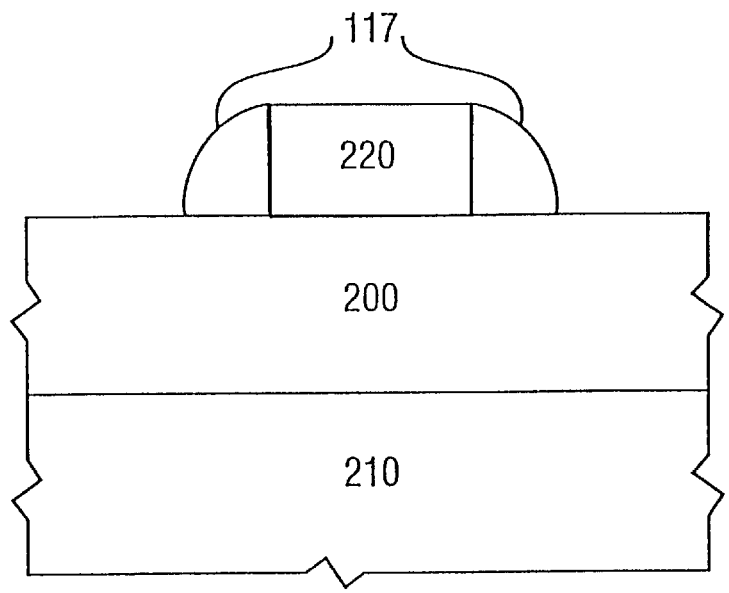
FIG. 4C is a cross section showing the resulting structure after spacers have been formed on the sides of the polysilicon.
Figure 4D:
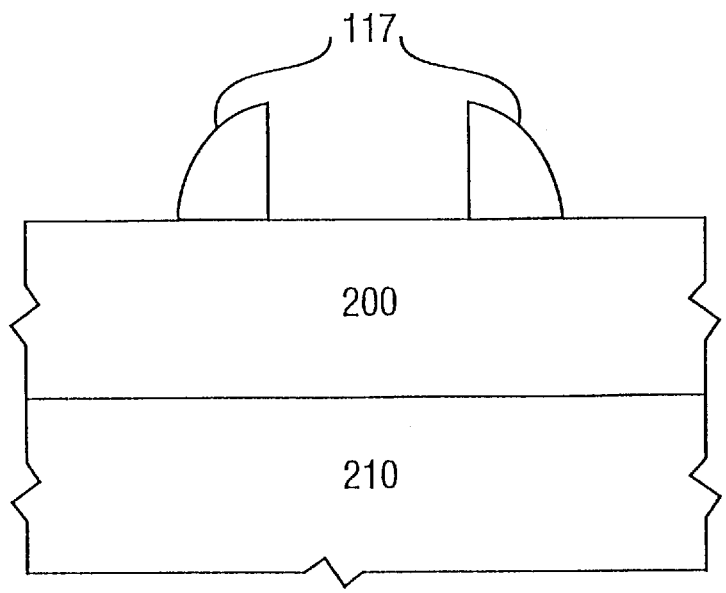
FIG. 4D is a cross section showing the resulting structure after the remaining polysilicon has been removed.
Figure 4E:
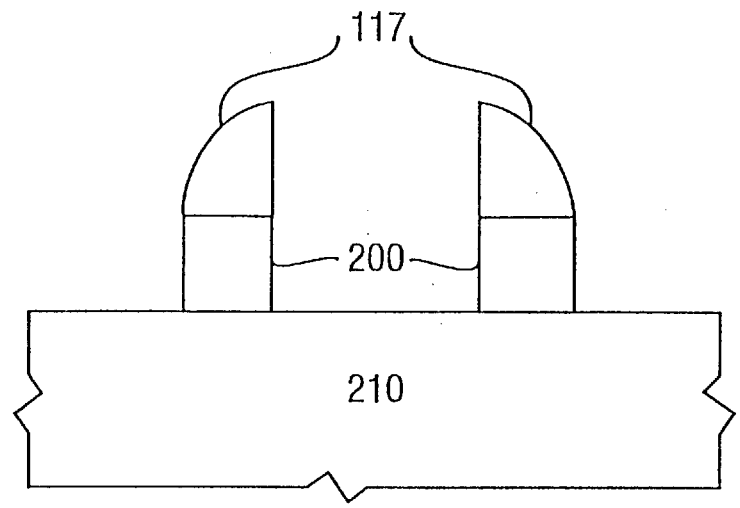
FIG. 4E is a cross section showing the resulting structure after an anisotropic metal etch.
Figure 4F:
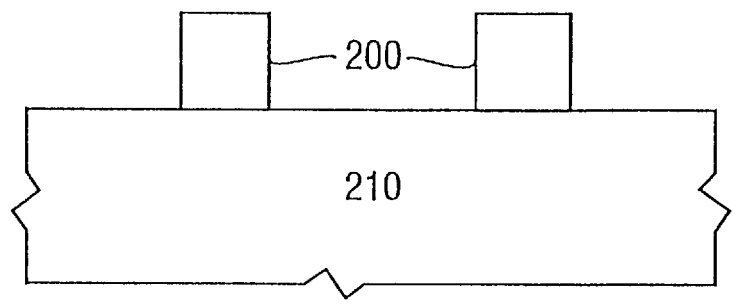
FIG. 4F is a cross section showing the resulting structure after spacer removal.

The use spacers as etching masks as disclosed in FIGS. 3A and 3B can also be used to manufacture more than just a ZPROM array. A variety of materials underlying spacers 117 can be anisotropically etched to form extremely thin strips of the underlying material. The use of spacers as etching masks can therefore be used more generally to produce conductors of extremely thin widths that could not otherwise be fabricated because of lithography resolution limitations. For example, and referring to FIG. 4A, a metallic conductor 200 (e.g., aluminum, tungsten or titanium) is deposited on top of a substrate 210. The substrate 210 refers generally to any suitable underlying material and need not refer to crystalline silicon. For example, substrate 210 could be comprised of a nitride. Next, polysilicon 220 has been deposited over metallic conductor 210. In FIG. 4B, the polysilicon 220 has been patterned and etched by traditional techniques. In FIG. 4C, oxide spacers 117 are formed as previously discussed. In FIG. 4D, the polysilicon is then removed using any suitable etch. In FIG. 4E, an anisotropic etch is used to remove the metallic conductor 210 where ever it does not underlie the spacers 117. Finally, in FIG. 4F, the spacers are removed, leaving metallic conductor 210 into two extremely thin strips. Notice that the lateral dimension of the strips is dictated solely by the lateral dimension of the spacers.

Figure 4G:
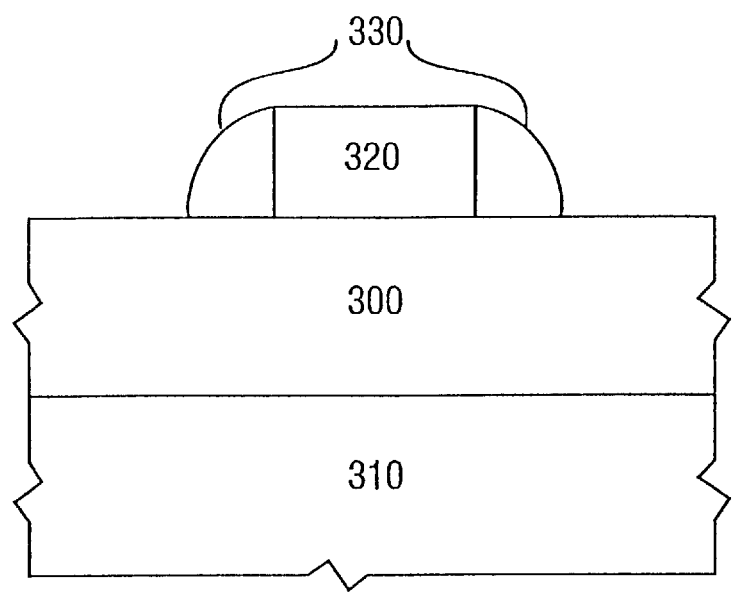
FIG. 4G is a cross section of the structure of FIG. 4C wherein the materials are left unspecified.

The disclosed technique for etching thin strips of material should not be limited to the embodiment disclosed herein. In fact, one of ordinary skill will realize that any combination of materials could be used in place of metallic conductor 210, substrate 210 and polysilicon 220, and oxide spacers 117. Referring to FIG. 4G, the disclosed embodiment is replaced generically by layer 300, layer 310, layer 320, and spacers 330. To etch layer 300 into thin strips, one should select etches that will not inadvertently etch away the materials selected for layers 300, 310, and 320, and spacers 330. For instance, the etch used to form spacers 330 should not significantly attack layer 320 or layer 300 where exposed. Likewise, the etchant selected to etch material 320 to leave only the spacers 330 over layer 300 should not significantly attack layer 300 or spacers 330. After layer 320 is removed, the etchant selected to anisotropically etch layer 300 should not significantly attack layer 310 or spacers 300. Lastly, the etchant selected to remove spacers 330 should not significantly attack the remaining thin strips of layer 300 or now exposed layer 310. By keeping these etching limitations in mind, many combinations of material could by picked for layers 300, 310, 320, and spacers 330 to form thin strips in layer 300.

Figure 5:
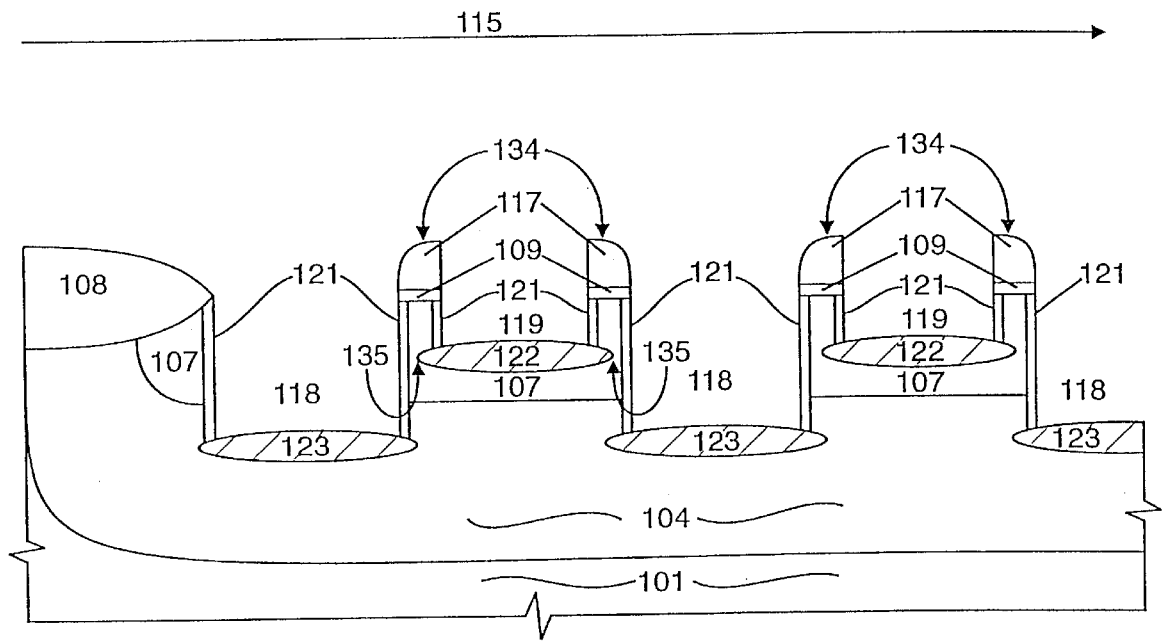
FIG. 5 is a cross section of a substrate showing the resulting structure in the array after silicidation.

Returning to the manufacture of the ZPROM array in FIG. 5, oxide 121 with thickness of about 100 to 500 Angstroms is thermally grown on all exposed silicon in array area 115. This oxide growth will consume any damage done to the side of the silicon wall 134 that may have resulted from the first and second silicon trench etches. Oxide 121 also protects the junction between the P doped region 107 and the array N-well 104 from damage during the remainder of the process. Oxide 121 is then subjected to an anisotropic etch which removes oxide 121 from the horizontal surfaces, including the bottom of deep trench area 118 and the bottom of shallow trench area 119. Oxide 121 continue to protect the junctions and to provide structural support for silicon walls 134.

Next, titanium is sputtered on the surface of the structure to a preferred thickness of up to approximately 1,000 Angstroms. After sputtering, the titanium is sintered to cause the titanium to alloy with the underlying silicon where it is exposed (i.e., where no oxides are present) to form a titanium silicide. Where the titanium so sputtered overlays an oxide and therefore does not alloy during the sintering process, it can be easily etched away leaving behind the titanium silicide, thus producing the bit line straps 122 and N-well straps 123. Silicidation of the bit line is beneficial because bit line straps 122 have a relatively low resistance compared to the P doped region 107, and thus enables signals to travel more quickly down the bit lines. Likewise, the N-well straps 123 enables array N-well 104 to better maintain a constant voltage by providing a low resistance escape path for any current leaking from the array. Although the Zener diode array is less susceptible to current leakage, high current densities could cause some leakage. Another benefit of silicidation is the lateral growth of titanium silicide. The lateral growth 135 under silicon walls 134 of bit line straps 122 is good for collecting current because it increases the electric fields under the silicon wall 134. In the extreme case, the lateral ends 135 will progress during sintering completely through the P doped silicon 107 and touch the silicon walls 134. In this case, the lateral ends 135 would collect all currents flowing from the Zener diodes, thus reducing parasitic currents that could form in the substrate.

Figure 6:
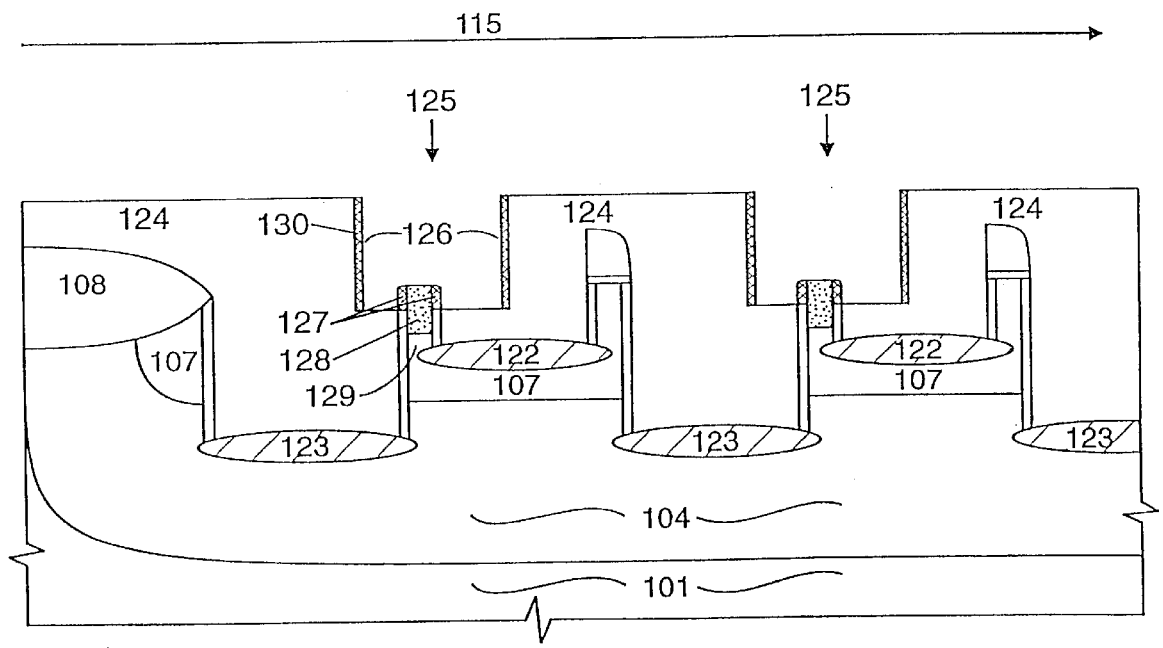
FIG. 6 is a cross section of a substrate showing the resulting structure in the array after an oxide has been deposited, contact holes have been etched in the oxide, and after ion implantation has been performed which forms the Zener diodes.

Referring to FIG. 6, an oxide 124 that is doped with boron and phosphorous is deposited on the surface of the structure. A low temperature reflow is then performed for the purpose of planarizing oxide 124, making its exposed surface substantially flat. It is well known that oxide containing boron and phosphorous, among other possible dopants, can be reflowed at relatively low temperatures. Additionally, the oxide 124 can be further planarized through the use of a chemical-mechanical process (CMP). The preferred thickness of oxide 124 after CMP or other planarizing process should be approximately 6,000 Angstroms as measured relative to the top of P doped region 107.

Next, contact holes 125 are patterned and etched in oxide 124. The dry etchant used should be anisotropic and should have good selectivity to etch oxides without etching the silicon walls 134. The effect is that the etch will remove not only oxide 124 where it is exposed, but also oxides 109 and 121 and spacers 117 (also made of oxide). The etch exposes the top and sides of either one or both silicon walls 134 of a bit line, but it should not expose more than 2,000 Angstroms of their sides measured relative to the top of P doped region 107. In FIG. 6, only one of the two silicon walls 134 on a given bit line is etched and exposed in this manner. One of ordinary skill will appreciate that contact holes 125 will ultimately define the location of the ZPROM cells and that several contact holes will be formed along a single bit line.

To form the Zener diodes, the exposed top of the silicon walls 134 must be implanted with N-type dopant, but the exposed sides of silicon walls 134 need to be protected from the implant in order to maintain a good Zener diode junction characteristics. Through the use of another oxide deposition and an anisotropic oxide etch, spacers 126 and 127 are created. Spacers 127 protect the exposed sides of silicon wall 134. With this protection, a large amount of N-type dopant is implanted into the silicon to create an N+ doped region 128. A Zener diode 129 is thus formed at the junction between P doped region 107 and N+ doped region 128. While the doping concentration and depth on N+ doped region 128 depend on desired Zener diode characteristics, a depth of 3000 Angstroms and a concentration of 1E19 atoms/cubic cm are preferred.

Figure 7:
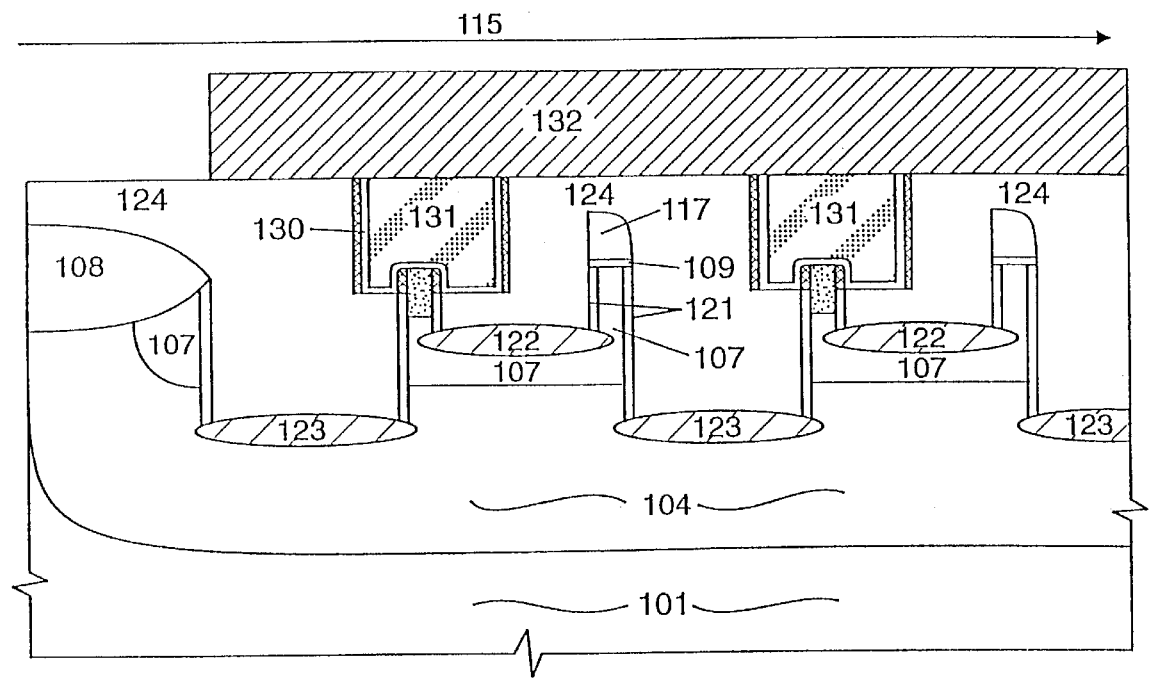
FIG. 7 is a cross section of a substrate showing the resulting structure in the array after the antifuse dielectric, polysilicon plugs, and word lines have been formed.

Referring to FIG. 7, programmable element 130 is deposited on the exposed N+ silicon 128 and is substantially uniformly over all surfaces. As noted in U.S. Pat. No. 5,379,250, programmable element 130 is preferably an antifuse and is comprised of silicon nitride (nitride), but an oxide or any material exhibiting stable electrical breakdown can be used. When programmable element 130 acts as an antifuse, a given cell will initially be non-conductive. When the cell is programmed by the application of a voltage which is high enough to cause the programmable element 130 to break down, the programmable element 130 will "antifuse" and become conductive. Programmable element 130 may also be a fuse. In this case, programmable element 130 is initially conductive, and will "fuse" and become nonconductive when a sufficiently high voltage is applied. To construct a fuse, programmable element 130 could, for instance, be comprised of a metal (e.g., platinum). When programmable element 130 acts as either a fuse or an antifuse, the cell will be programmable only one time and the effects of programming will be destructive and non-reversible. One time programmability will suffice for ROM applications. However, it is also desirable to construct the disclosed cell using a programmable element 130 which can be selectively programmed and deprogrammed. This feature would produce a cell where programming would be non-destructive and reversible, and would therefore be suitable for NVRAM (Non-volatile Random Access Memory) applications. One possible way to construct such a cell would be to use a programmable element 130 which is comprised of a chalcogenide. The electrical and physical properties of a suitable chalcogenide are disclosed in U.S. Pat. No. 5,296,716 and are incorporated herein by reference. Generally, the resistance of a suitable chalcogenide changes when high currents are passed through it, and the effects are reversible, because of a reversible transition which occurs between the chalcogenide's generally crystalline and generally amorphous states. By controlling the amount of current flowing through a given cell during programming, either a "zero" or "one" state can be expressed by differing chalcogenide resistances. A Zener diode array in which programmable element 130 is chalcogenide would therefor become a reprogrammable NVRAM, because the properties of a suitable chalcogenide would make it suitable for use as a reprogrammable element. Because of the feature of reprogrammability, the NVRAM is more useful than the ZPROM and could compete for a larger share of the memory market.

The thickness of programmable element 130 should be engineered to break down at the lowest consistent breakdown voltage possible. Similar optimization should be used if programmable element 130 were a fuse or a reprogrammable material, such as a suitable chalcogenide.

A conductive material is then deposited over programming element 130 which fills the contact holes 125 and (temporarily) covers oxide 124 (not shown). The preferred conductor is polysilicon, but tungsten, tungsten silicide, titanium nitride and aluminum are just a few of the possible conductors. With the polysilicon in place, a final heat cycle activates the CMOS dopants and the Zener diode dopants.

Planarization (preferably CMP) of the polysilicon removes it from on top of oxide 124 but leaves polysilicon plugs 131 in contact holes 125, as shown in FIG. 7. The polysilicon plugs 131 serve as the top plate of the antifuse and will eventually be electrically connected to array word line.

After the polysilicon plugs 131 are formed, the periphery contact holes are created by etching through whatever oxide is remaining after planarization of oxide 124 in the periphery area 115. The periphery contact etch pattern will leave the array area 114 covered with photoresist to protect array area 114 from the contact etch. The periphery contact etch will need to be optimized to clear away remaining oxide 124 and thick oxide layer 116 over the CMOS junctions and gates where contacts are desired. While it is important to the utility of the disclosed ZPROM process that one of its advantages is the ability of the process to be efficiently used in conjunction with existing CMOS processes, the periphery contact etch is not shown in FIG. 7. Finally, a metal layer 132 is deposited over both array area 114 and periphery area 115. The metal is patterned and anisotropically etched leaving substantially vertical walls on the remaining metal patterns. The resulting metal patterns will constitute the interconnects in the periphery area 115 and the word lines in array area 114. In periphery area 115, the interconnects make contact to the CMOS junctions and gate through the periphery contact holes and carry electrical signals from device to device. In array area 114, metal layer 132 is etched in strips which run perpendicular to the bit lines and make contact to several polysilicon plugs 131 to form a single word line or row in the array. Thus, the resulting structure shown in FIG. 7 shows a cross section through a single word line.

Figure 8:
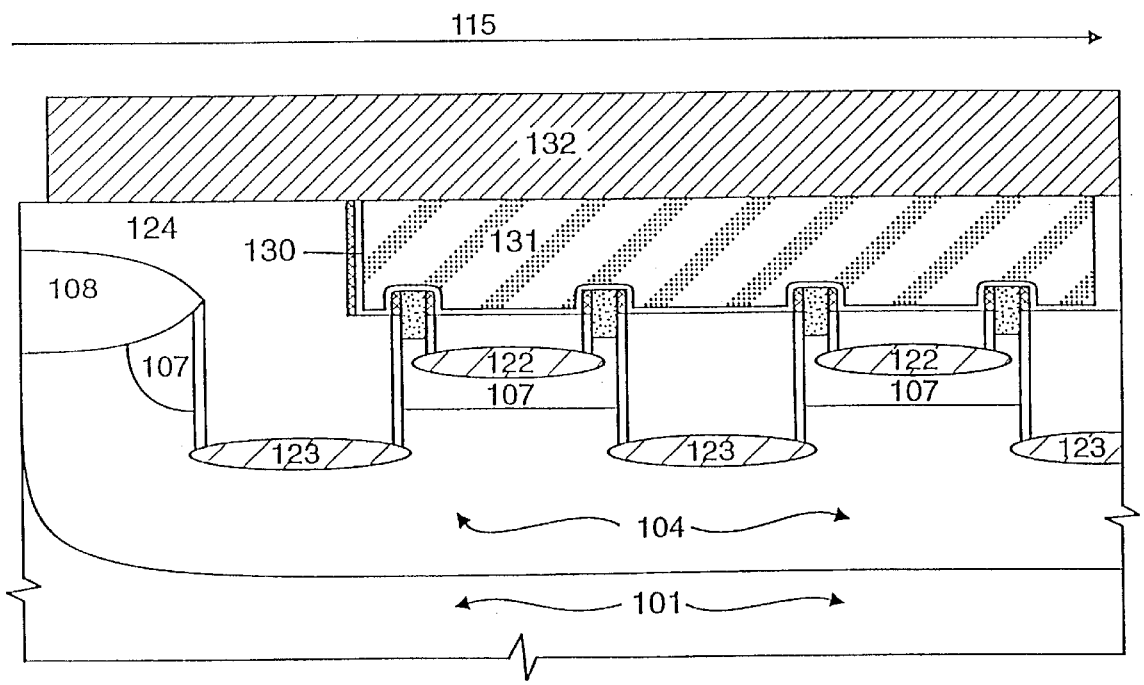
FIG. 8 is a cross section of a substrate showing an alternative embodiment wherein a trench is etched in the array oxide as opposed to contact holes.

Referring to FIG. 8, an alternate construction replaces the contact holes with a trench 133 running perpendicular to the bit lines. This is acceptable if both silicon walls 134 of a bit line are used in making Zener diodes and antifuse contacts. Per this construction, each ZPROM cell would consist of two Zener diodes (and their related antifuses) connected between the word line and the bit line in parallel. In most cases, the second Zener diode per bit line is redundant and would not hurt nor help the array operation. The trench construction allows for relaxed lithographic alignment constraints as compared to the stricter lithographic alignment requirements that are necessary for manufacturing contact holes.

Figure 9:
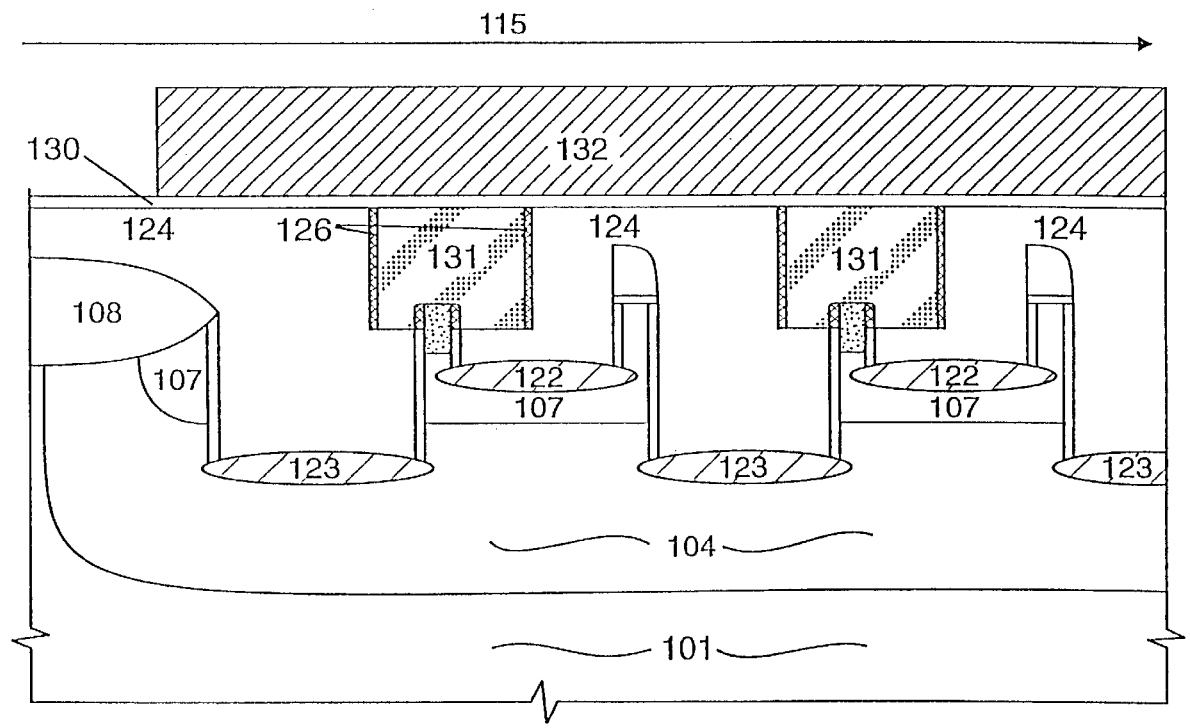
FIG. 9 is a cross section of a substrate showing an alternative embodiment wherein the antifuse dielectric is located above the polysilicon plugs.

Referring to FIG. 9, a third alternate construction moves programming element 130 to a position between the polysilicon plug 131 and word line 132. The benefit to having programming element 130 on top of oxide 124 and polysilicon plugs 126 is the ability to deposit certain programming films, such as chalcogenide, uniformly on a planar surface which would not otherwise deposit uniformly in holes or trenches.

Figure 10:
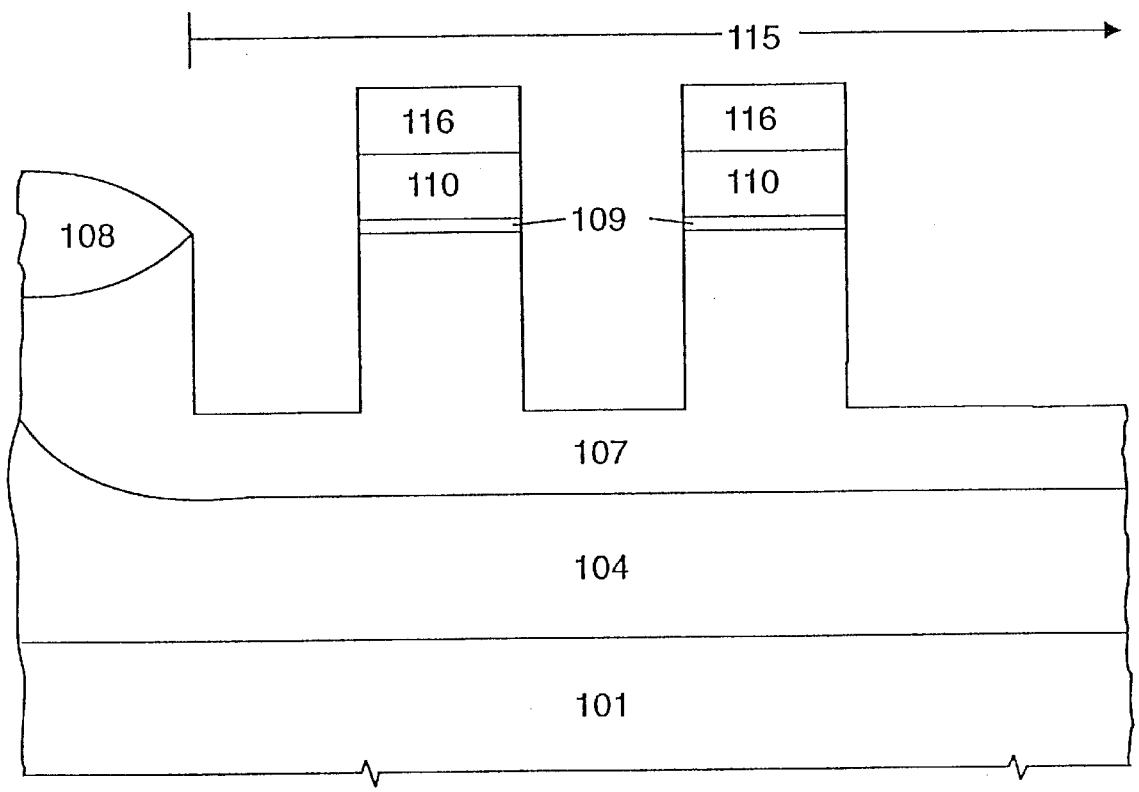
FIG. 10 is a cross section of a substrate of an alternative embodiment showing the resulting structure in the array after a trench etch is performed.

An alternative embodiment of a method for forming a ZPROM array is disclosed. Referring to FIG. 10, array area 115 has been patterned and etched to form the structure shown. First, thick oxide 116 is patterned as shown. Then, using the thick oxide 116 as an etching mask, polysilicon 110 is anisotropically etched. Because the anisotropic polysilicon 110 etch will likely stop on oxide 109, oxide 109 may need to independently be anisotropically etched as well. This will remove a little of oxide 116, but not enough to be of any consequence. After oxide 109 is removed, an anisotropic trench etch is performed to remove a portion of P doped region 107 as shown. The thick oxide 116 will protect the underlying polysilicon 110 from attack during the trench etch. Alternatively, the polysilicon 110 could be patterned in the first instance by removing the thick oxide 116 form the array and patterning the polysilicon 110 by traditional techniques. The photoresist from the polysilicon 110 etch is then used instead of the thick oxide 116 to protect the underlying polysilicon 110 from attack during the trench etch. The use of this modification would result in the structure shown in FIG. 10 minus thick oxide 116.

Figure 11:
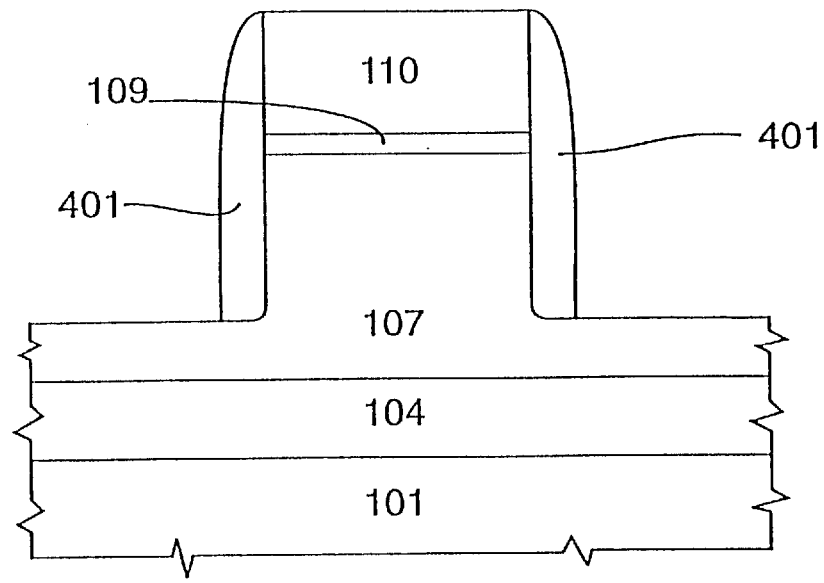
FIG. 11 is a cross section of a substrate showing the resulting structure in the array after spacer definition.
Figure 12:
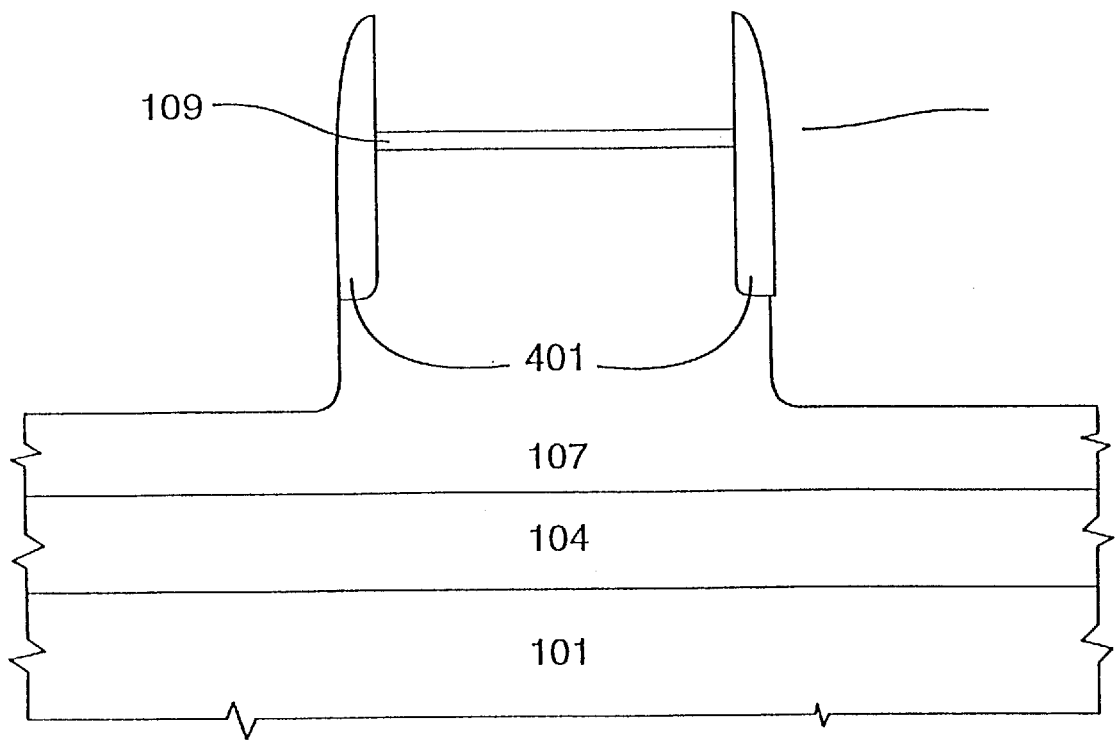
FIG. 12 is a cross section of a substrate showing the resulting structure in the array after an overlying polysilicon layer is removed by etching.
Figure 13:
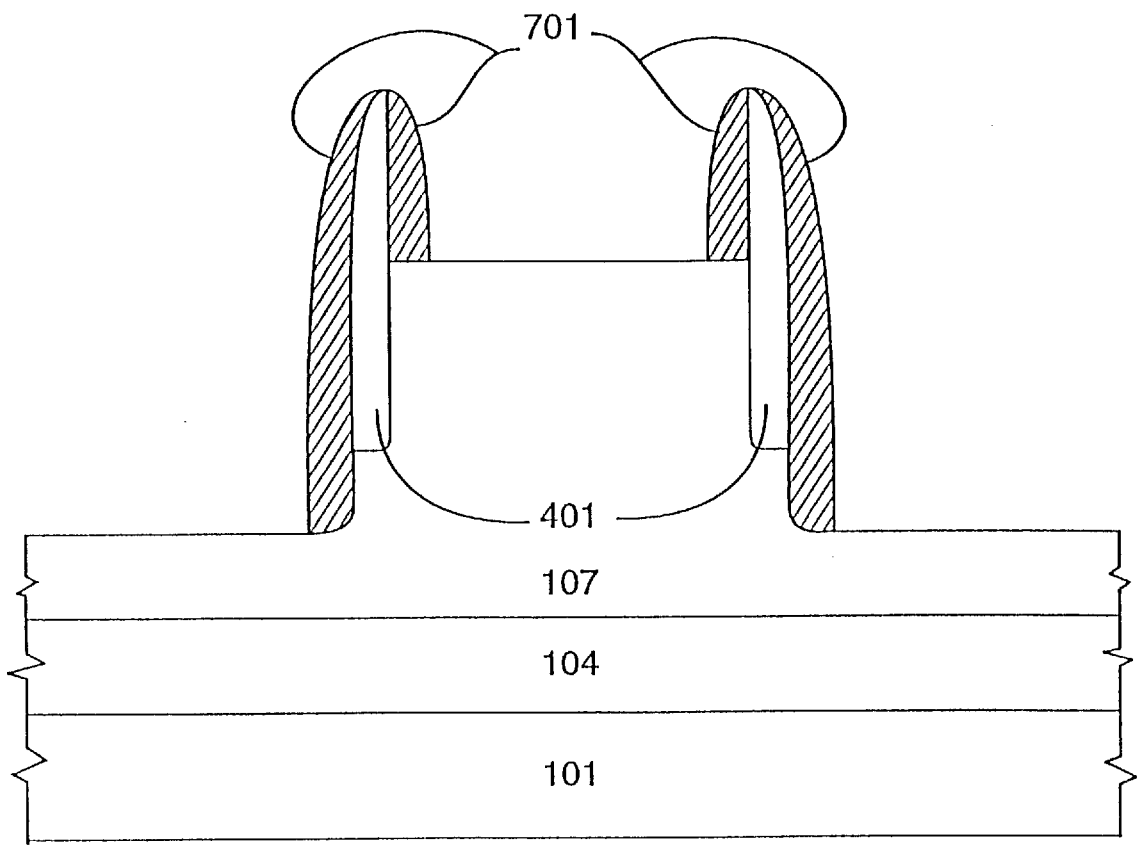
FIG. 13 is a cross section of a substrate showing the resulting structure in the array after a second spacer definition.
Figure 14:
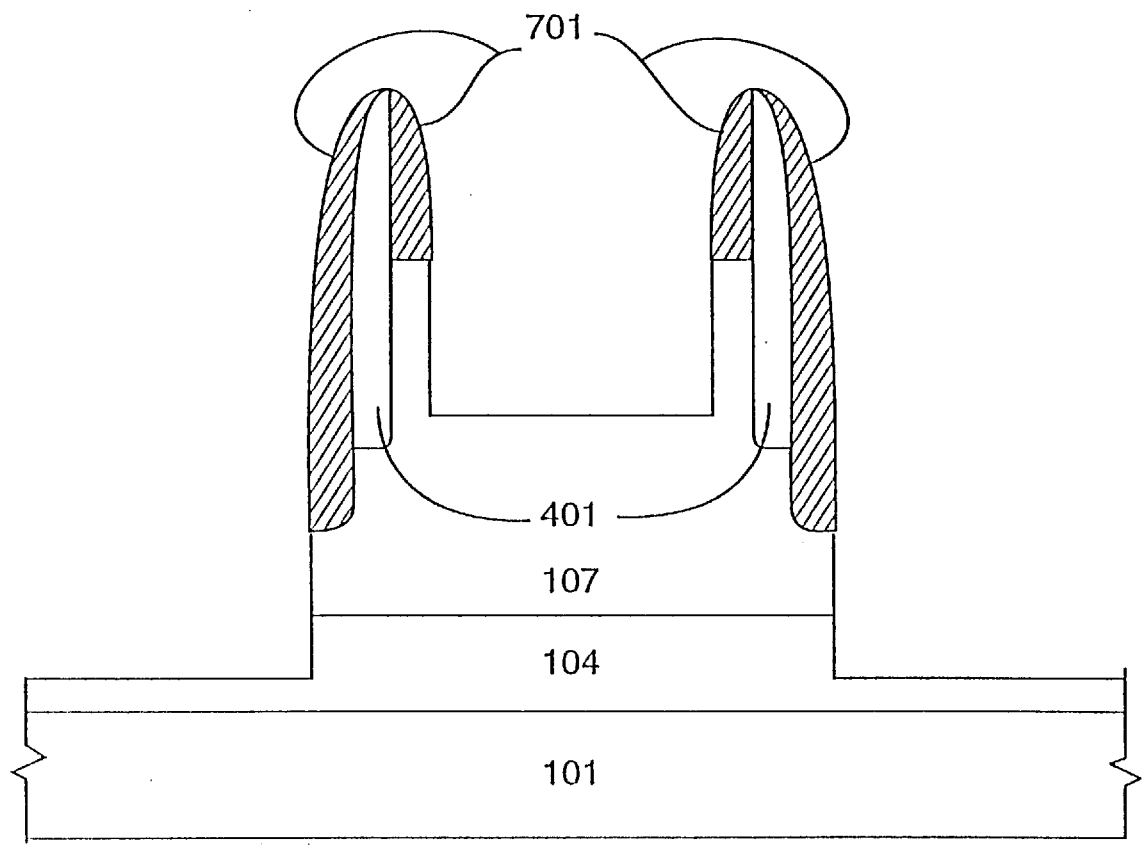
FIG. 14 is a cross section of a substrate showing the resulting structure in the array after a second trench etch is performed.

Referring to FIG. 11, a conformal oxide is deposited over the structure and is anisotropically etched to form first spacers 401. Thick oxide 116 will be removed by the anisotropic etch which is used to form spacers 401 (if it is still present at this point in the process). Referring to FIG. 12, a first silicon trench etch is used to remove the exposed polysilicon 110 and a portion of P doped region 107. Referring to FIG. 13, another conformal oxide is deposited and anisotropically etched to form second spacers 701. Referring to FIG. 14, a second silicon trench etch is performed to produce the structure shown. This structure is basically equivalent to the structure shown in FIG. 3B, and from this point on the ZPROM array can be manufactured using the remaining steps as explained in the text accompanying FIGS. 5 to 9.

Figure 15A:
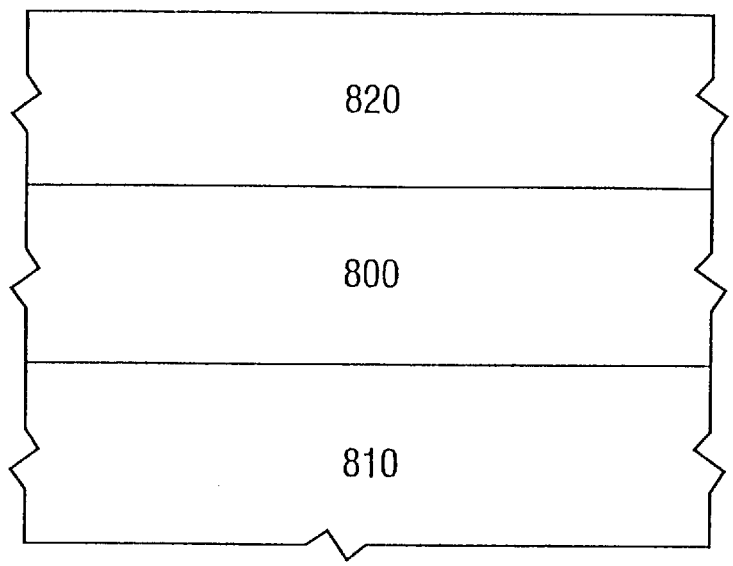
FIG. 15A is a cross section of polysilicon over metal.
Figure 15B:
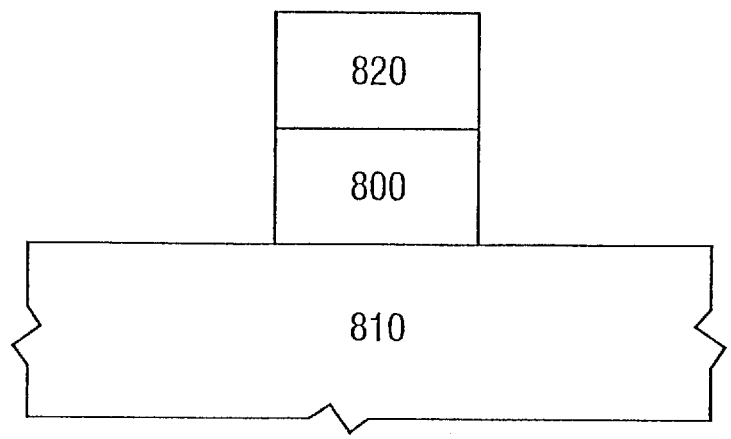
FIG. 15B is a cross section showing the resulting structure after pattern and polysilicon and metal etch.
Figure 15C:
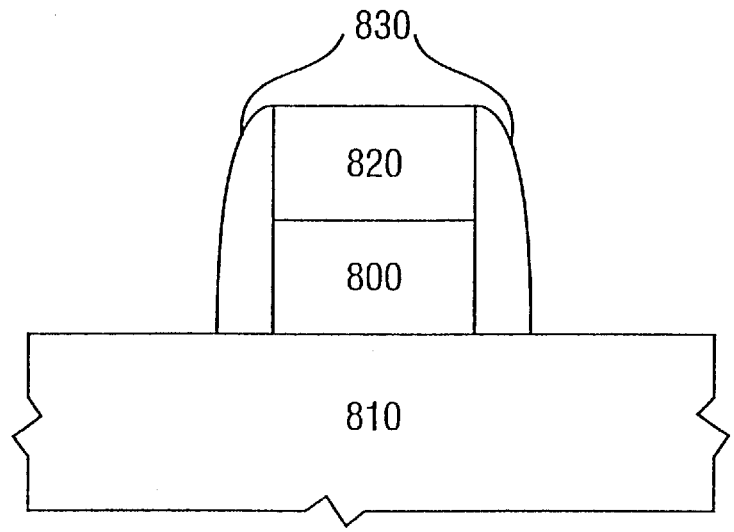
FIG. 15C is a cross section showing the resulting structure after first spacers have been formed on the sides of the polysilicon and the metal.
Figure 15D:
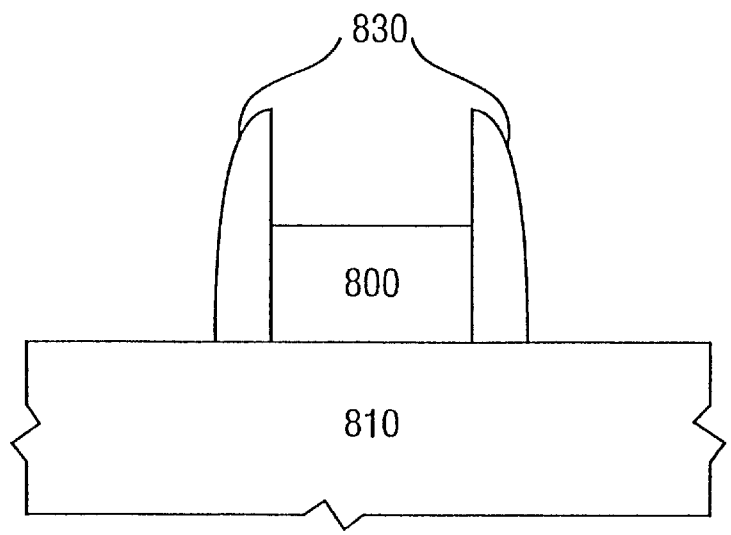
FIG. 15D is a cross section showing the resulting structure after the remaining polysilicon has been removed.
Figure 15E:
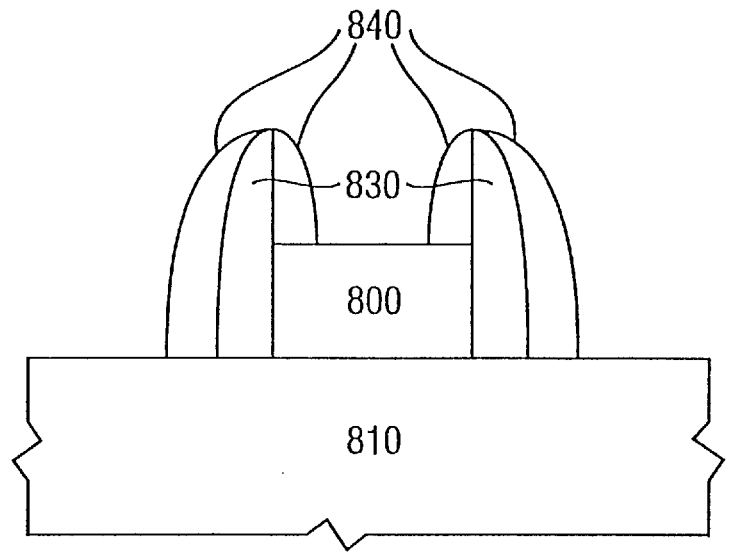
FIG. 15E is a cross section showing the resulting structure after second spacers have been formed.
Figure 15F:
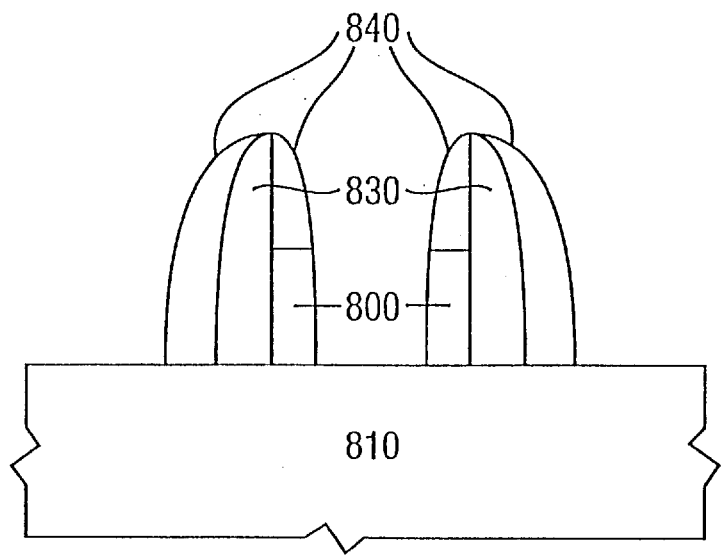
FIG. 15F is a cross section showing the resulting structure after an anisotropic metal etch.
Figure 15G:
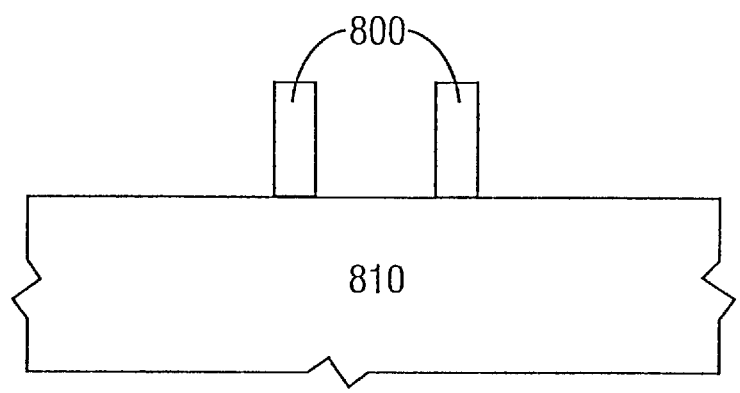
FIG. 15G is a cross section showing the resulting structure after spacer removal, and a cross section of the structure of FIG. 4C wherein the materials are left unspecified.

The manufacturing methods disclosed in the alternative embodiment can also be used to form extremely thin strips of a material which underlies the second spacers. Referring to FIG. 15, a metallic conductor 800 (e.g., aluminum, tungsten or titanium) is deposited on top of a substrate 810. The substrate 810 refers generally to any suitable underlying material and need not refer to crystalline silicon. For example, substrate 810 could be comprised of a nitride. Next, polysilicon 820 has been deposited over metallic conductor 810. In FIG. 15B, both the polysilicon 820 and the metallic conductor 800 have been etched to produce the structure shown. The formation of the structure may actually take place in two stages. First, the polysilicon 820 is patterned and etched using traditional means. Then, metallic conductor 800 is anisotropically etched using the polysilicon 820 as an etching mask. In FIG. 15C, first oxide spacers 830 are formed on the sides of the structure. In FIG. 15D, the remaining polysilicon is removed. In FIG. 15E, second oxide spacers 840 are formed on all substantially vertical sides of the structure. In FIG. 15F, metallic conductor 800 is anisotropically etched. Where the metallic conductor is protected by the overlying second oxide spacer 840, the metallic conductor 800 will remain.

The same etching considerations with respect to forming extremely thin strips of material that were explained in the first embodiment are equally applicable here. To reiterate, care should be taken to select etchants such that other materials are not adversely effected.

What is claimed is:

1. A method for manufacturing an array of memory cells, comprising:
    (a) forming a first doped region in a semiconducting substrate which is doped of opposite polarity to the substrate;
    (b) forming a second doped region within the first doped region which is doped of opposite polarity to the first doped region;
    (c) forming a first thin dielectric at the surface of the second doped region;
    (d) forming a first layer over the first thin dielectric and selectively etching the first layer to leave only strips of the first layer;
    (e) forming spacers on the edges of the remaining first layer strips to form a spacer pair;
    (f) anisotropically etching the remaining structure to remove the remaining portions of the first layer while simultaneously etching a portion of the exposed second doped region but leaving the spacers and structures underlying the spacers intact;
    (g) etching the remaining exposed portions of the first thin dielectric;
    (h) anisotropically etching the remaining structure to remove a portion of the second doped region between a given spacer pair, and to remove the remaining portion of the exposed second doped region outside of a given spacer pair such that the first doped region is exposed, but leaving the first spacers and structures underlying the spacers intact;
    (i) forming a thick dielectric over the resulting structure;
    (j) etching a portion of the thick dielectric and an underlying spacer to expose a portion of the second doped region which was previously underneath the spacer;
    (k) implanting the exposed portion of the second doped region with a dopant of opposite polarity to the second doped region to form a third doped region, thereby forming a diode at the junction of the second doped region and the third doped region;
    (l) forming a programmable element over the third doped region; and
    (m) forming a second layer and selectively etching the second layer to leave only strips of the second layer which run generally perpendicular to the remaining second doped region, whereby the second layer strips are electrically connected to the programmable element.

2. The method of claim 1, wherein the remaining portions of the second doped region function as the first set of array bit lines and the remaining portions of the second layer function as the second set of array lines.

3. The method of claim 1, wherein the first layer is comprised of polysilicon.

4. The method of claim 1, wherein the second layer is comprised of polysilicon, tungsten, tungsten silicide, titanium nitride or aluminum.

5. The method of claim 1, wherein the programming element is a dielectric.

6. The method of claim 5, wherein the dielectric is oxide or nitride.

7. The method of claim 1, wherein the programming element is a reprogrammable element.

8. The method of claim 7, wherein the reprogrammable element is chalcogenide.

9. A method for manufacturing an integrated circuit utilizing the method of claim 1, wherein the thin dielectric and first layer respectively constitute the gate dielectric and gate of the CMOS transistors which appear in the periphery.

10. A method for manufacturing an array of memory cells, the method comprising the steps of:
    (a) forming a first doped region in a semiconductive substrate;
    (b) forming a second doped region in the first doped region, the second doped region being doped opposite the first doped region;
    (c) forming a first dielectric layer over the second doped region;
    (d) forming strips of material over the first dielectric layer;
    (e) forming spacers along the strips;
    (f) using the spacers as a mask, performing an etching operation to form a portion of the second doped region into a plurality of bit lines;

(g) forming a second dielectric layer over the resulting structure;

(h) forming contact holes over selected spacers and removing the selected spacers to expose selected portions of the second doped region;

(i) doping the exposed selected portions of the second doped region to form a plurality of diodes;

(j) operatively coupling programmable elements to the plurality of diodes; and (k) forming a plurality of word lines operatively coupled to at least one selected programmable element and extending generally perpendicular to the plurality of bit lines.

11. The method, as set forth in claim 10, wherein the strips of material comprise polysilicon.

12. The method, as set forth in claim 10, wherein the diodes comprise zener diodes.

13. The method, as set forth in claim 10, wherein the plurality of word lines comprise one of polysilicon, tungsten, tungsten silicide, titanium nitride, and aluminum.

14. The method, as set forth in claim 10, wherein step (f) comprises the step of forming a strapping layer on each of the plurality of bit lines.

15. The method, as set forth in claim 14, wherein the strapping layer comprises a silicide.

16. The method, as set forth in claim 15, wherein the silicide comprises titanium silicide.

17. The method, as set forth in claim 10, wherein step (f) comprises the step of forming a third dielectric layer over non-horizontal surfaces of the resulting structure.

18. The method, as set forth in claim 10, wherein the programmable element comprises a dielectric.

19. The method, as set forth in claim 10, wherein the programmable element comprises chalcogenide.

20. The method, as set forth in claim 10, wherein the programmable element is reprogrammable.

21. A method for manufacturing an array of memory cells, the method comprising the steps of:

(a) forming a first doped region in a semiconductive substrate;

(b) forming a second doped region in the first doped region, the second doped region being doped opposite the first doped region;

(c) forming a first dielectric layer over the second doped region;

(d) forming strips of material over the first dielectric layer;

(e) forming spacers along the strips;

(f) using the spacers as a mask, etching away the material strips, portions of the first dielectric layer, portions of the second doped region, and portions of the first doped region to form a plurality of bit lines;

(g) forming a second dielectric layer over the resulting structure;

(h) forming contact holes over selected spacers and removing the selected spacers to expose selected portions of the second doped region;

(i) doping the exposed selected portions of the second doped region to form a plurality of diodes;

(j) operatively coupling programmable elements to the plurality of diodes; and (k) forming a plurality of word lines operatively coupled to at least one selected programmable element and extending generally perpendicular to the plurality of bit lines.

22. The method, as set forth in claim 21, wherein the strips of material comprise polysilicon.

23. The method, as set forth in claim 21, wherein the diodes comprise zener diodes.

24. The method, as set forth in claim 21, wherein the plurality of word lines comprise one of polysilicon, tungsten, tungsten silicide, titanium nitride, and aluminum.

25. The method, as set forth in claim 21, wherein step (f) comprises the step of forming a strapping layer on each of the plurality of bit lines.

26. The method, as set forth in claim 25, wherein the strapping layer comprises a silicide.

27. The method, as set forth in claim 26, wherein the silicide comprises titanium silicide.

28. The method, as set forth in claim 24, wherein step (f) comprises the step of forming a third dielectric layer over non-horizontal surfaces of the resulting structure.

29. The method, as set forth in claim 21, wherein the programmable element comprises a dielectric.

30. The method, as set forth in claim 21, wherein the programmable element comprises chalcogenide.

31. The method, as set forth in claim 21, wherein the programmable element is reprogrammable.

* * * * *